(12) United States Patent
Zou et al.

(10) Patent No.: US 9,287,381 B2
(45) Date of Patent: Mar. 15, 2016

(54) THIN FILM TRANSISTOR AND METHOD FOR MAKING THE SAME

(71) Applicants: Tsinghua University, Beijing (CN); HON HAI PRECISION INDUSTRY CO., LTD., New Taipei (TW)

(72) Inventors: Yuan Zou, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 58 days.

(21) Appl. No.: 14/139,966

(22) Filed: Dec. 24, 2013

(65) Prior Publication Data

US 2014/0306185 A1 Oct. 16, 2014

(30) Foreign Application Priority Data

Apr. 16, 2013 (CN) .......................... 2013 1 01306096

(51) Int. Cl.
| | |
|---|---|
| *H01L 29/06* | (2006.01) |
| *H01L 29/66* | (2006.01) |
| *H01L 51/05* | (2006.01) |
| H01L 51/00 | (2006.01) |
| B82Y 40/00 | (2011.01) |

(52) U.S. Cl.
CPC ...... *H01L 29/66045* (2013.01); *H01L 51/0562* (2013.01); *B82Y 40/00* (2013.01); *H01L 51/0048* (2013.01)

(58) Field of Classification Search
CPC .......................... H01L 29/7606; B82Y 10/00
USPC ....................... 257/29; 438/158; 977/842, 938
See application file for complete search history.

(56) References Cited

U.S. PATENT DOCUMENTS

| | | | | |
|---|---|---|---|---|
| 6,626,720 | B1 * | 9/2003 | Howard et al. .................. | 445/24 |
| 7,301,802 | B2 * | 11/2007 | Bertin et al. .................... | 365/164 |
| 7,522,040 | B2 * | 4/2009 | Passmore et al. ............... | 340/540 |
| 8,101,953 | B2 * | 1/2012 | Jiang et al. ...................... | 257/66 |
| 2005/0037547 | A1 * | 2/2005 | Bertin et al. .................... | 438/142 |

(Continued)

OTHER PUBLICATIONS

Javey et al. "Carbon Nanotube Field-Effect Transistors With Integrated Ohmic Contacts And High-K Gate Dielectrics", Nano Letters, 2004, 4 (3), pp. 447-450, DOI: 10.1021/nL035185x, Publication Date (Web): Feb. 20, 2004.*

(Continued)

*Primary Examiner* — Jami M Valentine

(74) *Attorney, Agent, or Firm* — Novak Druce Connolly Bove + Quigg LLP

(57) ABSTRACT

A thin film transistor is provided. The thin film transistor includes a source electrode, a drain electrode, a semiconducting layer, an insulating layer and a gate electrode. The insulating layer has a first surface and a second surface opposite to the first surface. The gate electrode is located on the first surface of the insulating layer. The source electrode, the drain electrode, and the semiconductor layer are located on the second surface of the insulating layer. The gate electrode, the source electrode, and the drain electrode include a first carbon nanotube layer. The semiconductor layer includes a second carbon nanotube layer. A first film resistor of the first carbon nanotube layer is smaller than or equal to 10 kΩ per square. A second film resistor of the second carbon nanotube layer is greater than or equal to 100 kΩ per square.

13 Claims, 8 Drawing Sheets

(56) References Cited

U.S. PATENT DOCUMENTS

2009/0057762 A1* 3/2009 Bangsaruntip et al. ....... 257/347
2009/0173516 A1* 7/2009 Burke et al. ............... 174/126.1
2009/0184389 A1* 7/2009 Bertin et al. .................. 257/476
2010/0038625 A1* 2/2010 Bertin ............................ 257/9
2010/0039138 A1* 2/2010 Bertin ............................ 326/38
2011/0031499 A1* 2/2011 Kimura et al. ................ 257/59
2013/0119345 A1* 5/2013 Park et al. ...................... 257/13

OTHER PUBLICATIONS

Cao Qing et al.: "Transparent flexible organic thin-film that use printed single-walled carbon", Applied Physics Letters, AIP, American Institute of Physics, Melville, Ny, US, vol. 88, No. 11, Mar. 15, 2006, pp. 113511.*

* cited by examiner

THIN FILM TRANSISTOR AND METHOD FOR MAKING THE SAME

This application claims all benefits accruing under 35 U.S.C. §119 from China Patent Application No. 201310130609.6, filed on Apr. 16, 2013 in the China Intellectual Property Office, the contents of which are hereby incorporated by reference.

BACKGROUND

1. Technical Field

The present invention relates to thin film transistors and, particularly, to a carbon nanotube based thin film transistor.

2. Description of Related Art

A typical thin film transistor (TFT) is made of a substrate, a gate electrode, an insulation layer, a drain electrode, a source electrode, and a semiconductor layer. The thin film transistor performs a switching operation by modulating an amount of carriers accumulated in an interface between the insulation layer and the semiconductor layer from an accumulation state to a depletion state, with applied voltage to the gate electrode, to change an amount of the current passing between the drain electrode and the source electrode.

Material of semiconductor layer is semiconductive material and materials of source electrode and drain electrode are metal materials. Because materials of source electrode and drain electrode are different from material of semiconductor layer, interface barrier existed between the semiconductor layer and the source electrode or the drain electrode has an adversely effect to the property of thin film transistor. Furthermore, the thickness of the semiconductor layer, the source electrode and the drain electrode is relatively large which affects the light transmittance of the thin film transistor.

What is needed, therefore, is a thin film transistor that can overcome the above-described shortcomings.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
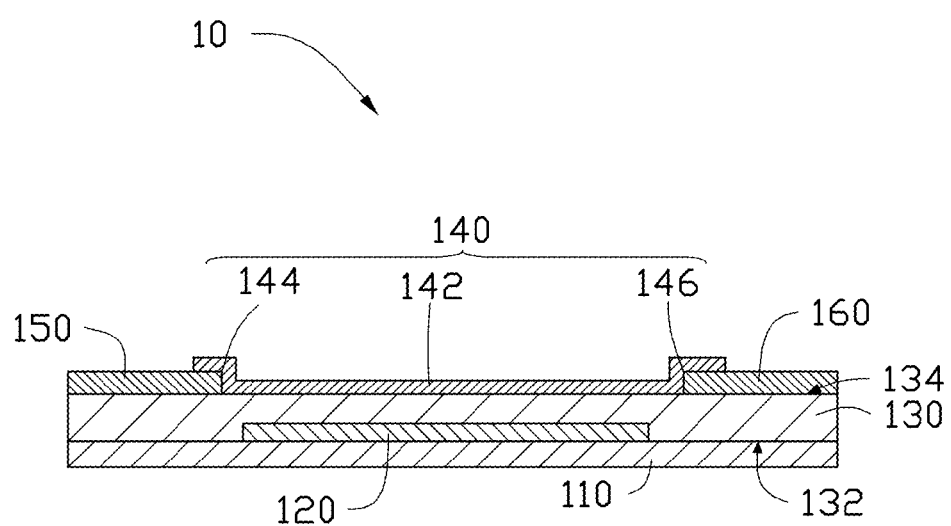
FIG. 1 is a cross sectional view of one embodiment of a thin film transistor.
Figure 2:
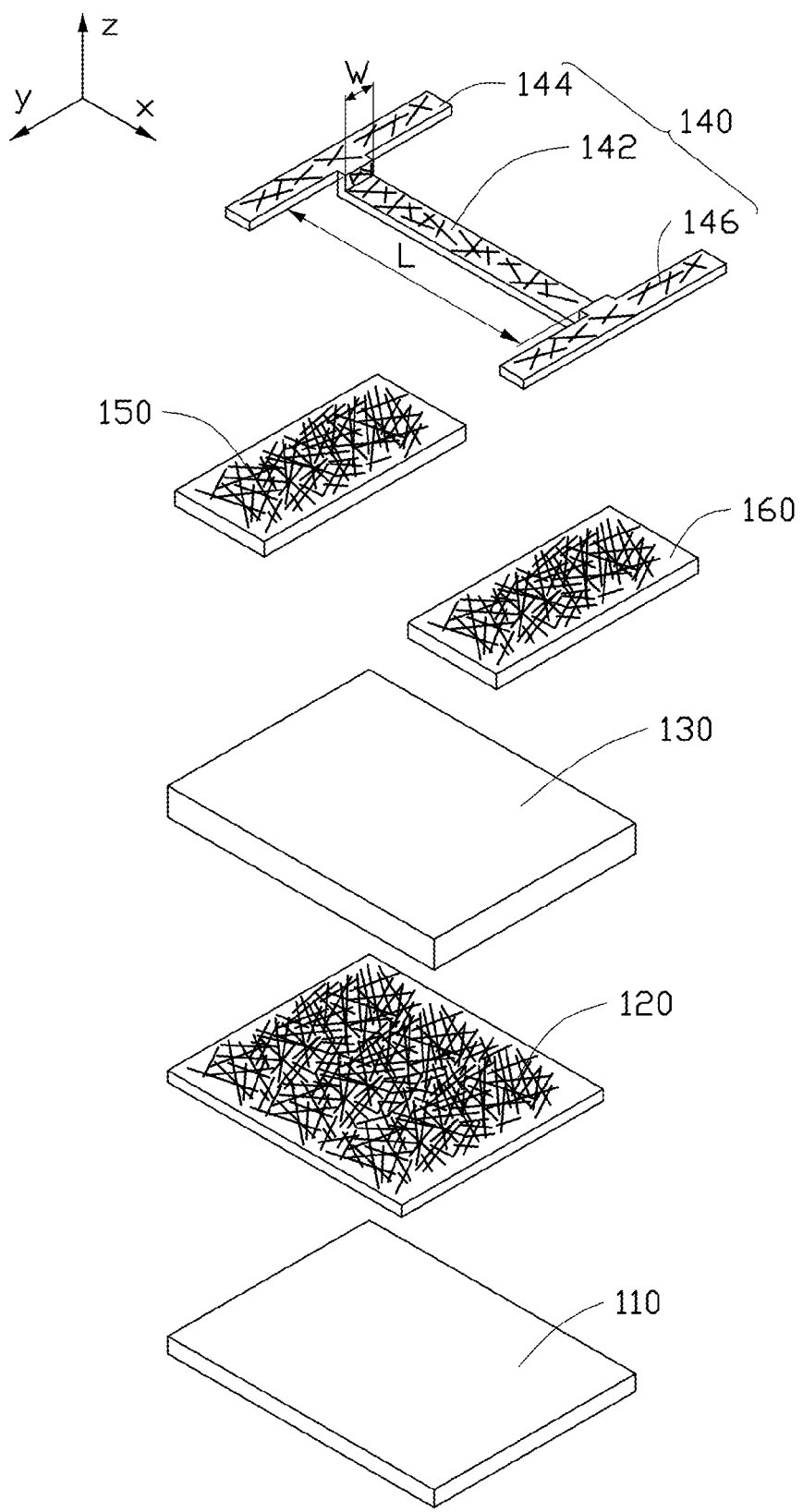
FIG. 2 is a schematic structural view of the thin film transistor of FIG. 1.

Referring to FIG. 1 and FIG. 2, a thin film transistor 10 of one embodiment includes a gate electrode 120, an insulating layer 130, a semiconductor layer 140, a source electrode 150, and a drain electrode 160. The insulating layer 130 has a first surface 132 and a second surface 134 opposite to the first surface 132. The gate electrode 120 is located on the first surface 132. The semiconductor layer 140, the source electrode 150, and the drain electrode 160 are located on the second surface 134. The thin film transistor 10 is positioned on a surface of an insulating substrate 110.

The source electrode 150 and the drain electrode 160 are spaced from each other. The semiconductor layer 140 is electrically connected to the source electrode 150 and the drain electrode 160. The gate electrode 120 is insulated from the semiconductor layer 140, the source electrode 150, and the drain electrode 160 through the insulating layer 130.

The thin film transistor 10 can be a bottom gate structure. In detail, the gate electrode 120 is located on the insulating substrate 110. The insulating layer 130 covers the gate electrode 120, and a part of the insulating layer 130 is directly located on the insulating substrate 110. The semiconductor layer 140 is located between and extends onto the source electrode 150 and the drain electrode 160. A part of the semiconductor layer 140 between the source electrode 150 and the drain electrode 160 is defined as a middle part 142. The middle part 142 is defined as a channel. A part of the semiconductor layer 140 overlapped with the source electrode 150 is defined as a first connecting part 144. A part of the semiconductor layer 140 overlapped with the drain electrode 160 is defined as a second connecting part 146. In one embodiment, the first connecting part 144 is located on and in contact with a surface of the source electrode 150 away from the insulating layer 130, and the second connecting part 146 is located on and in contact with a surface of the drain electrode 160 away from the insulating layer 130.

The insulating substrate 110 is provided for supporting the thin film transistors 10. The material of the insulating substrate 110 can be rigid materials, such as glass, crystal, ceramic, diamond, and silicon, or flexible materials such as plastic or resin. In detail, the flexible material can be polycarbonate (PC), polymethyl methacrylate acrylic (PMMA), polyethylene terephthalate (PET), polyethersulfone (PES), cellulose ester, polyvinyl chloride (PVC), benzocyclobutenes (BCB), acrylic resins, acrylonitrile butadiene styrene (ABS), polyamide (PA), or combination thereof. In one embodiment, the material of the insulating substrate is PET. The shape and size of the insulating substrate 110 are arbitrary.

Figure 3:
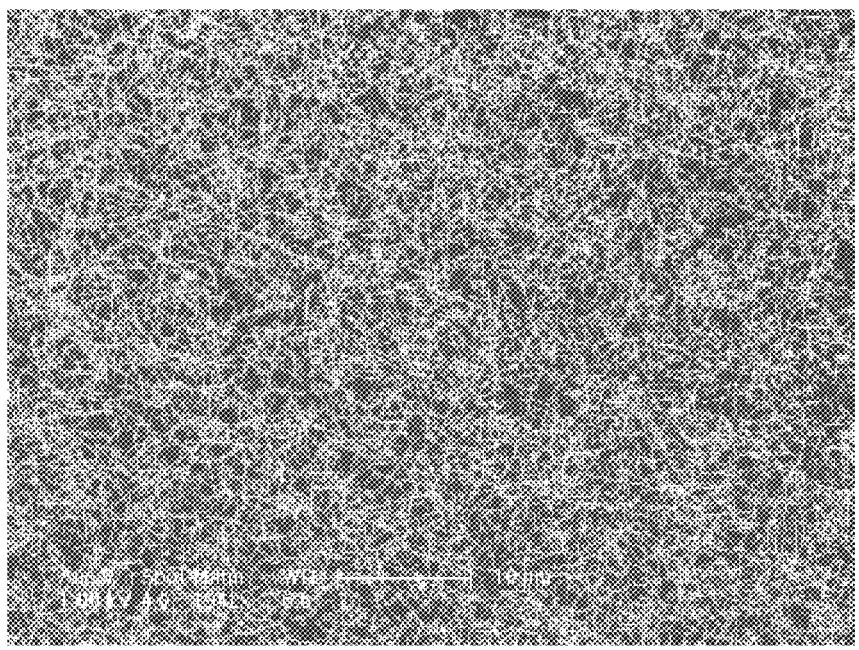
FIG. 3 is a Scanning Electron Microscope (SEM) image of a first carbon nanotube layer.

The gate electrode 120, the source electrode 150, and the drain electrode 160 can include a first carbon nanotube layer. Referring to FIG. 3, the first carbon nanotube layer includes a plurality of first carbon nanotubes joined by van der Waals attractive force. The plurality of first carbon nanotubes is single-walled carbon nanotubes and arranged disordered. The term 'disordered' is defined as the plurality of first carbon nanotubes is arranged along many different directions, and the aligning directions of the plurality of first carbon nanotubes are random. The plurality of first carbon nanotubes arranged along each different direction can be almost the same (e.g. uniformly disordered). The disordered first carbon nanotubes can be isotropic. The disordered first carbon nanotubes entangle with each other to form the first carbon nanotube layer, and a plurality of apertures is defined by the plurality of first carbon nanotubes. A diameter of the aperture can smaller than 50 micrometers. The plurality of the apertures can enhance the light transparence of the first carbon nanotube layer.

The plurality of first carbon nanotubes is substantially parallel with a surface of the first carbon nanotube layer. The plurality of first carbon nanotubes has a large distribution density. The plurality of first carbon nanotubes are connected with each other and form a conductive network. In one embodiment, number of the first carbon nanotubes in 1 square micrometers is equal to or greater than 20. The number of carbon nanotubes in 1 square micrometers is defined as distribution density. The first carbon nanotube layer has a small film resistor and a great electric conductive property. In one embodiment, the first film resistor $R_{s1}$ of the first carbon nanotube layer is smaller than or equal to 10 kΩ per square.

A diameter of first carbon nanotubes is smaller than about 10 nanometers. A length of first carbon nanotubes ranges from about 1 micrometer to about 2 millimeters. In one embodiment, the diameter of first carbon nanotubes is about 6 nanometers, the length of first carbon nanotubes ranges from about 5 micrometers to about 100 micrometers.

In one embodiment, a thickness of the first carbon nanotube layer is about 6 nanmometers, the first film resistor $R_{s1}$ of the first carbon nanotube layer is about 5 kΩ per square, a length of the gate electrode 120, the source electrode 150, and the drain electrode 160 is about 10 micrometers, a width of the gate electrode 120, the source electrode 150, and the drain electrode 160 is about 10 micrometers.

Figure 4:
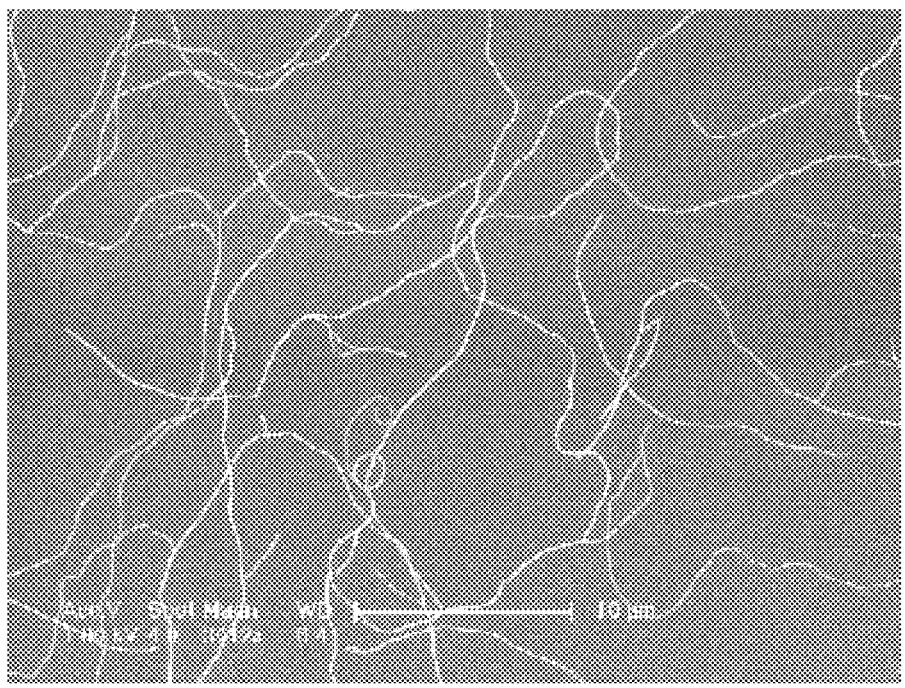
FIG. 4 is an SEM image of a second carbon nanotube layer.

The semiconductor layer 140 can include a second carbon nanotube layer. Referring to FIG. 4, the second carbon nanotube layer includes a plurality of second carbon nanotubes joined by van der Waals attractive force. The plurality of second carbon nanotubes is single-walled carbon nanotubes and arranged disordered. The second carbon nanotube layer and the first carbon nanotube layer have different distribution density of carbon nanotubes. Number of the plurality of second carbon nanotubes in 1 per square micrometer is smaller than or equal to 1. The distribution density of the plurality of first carbon nanotubes is about 20 times that of the plurality of second carbon nanotubes. The second carbon nanotube layer has a larger film resistor than the first carbon nanotube layer. In one embodiment, the second film resistor $R_{s2}$ of the second carbon nanotube layer is greater than or equal to 100 kΩ per square.

A diameter of second carbon nanotubes is smaller than about 5 nanometers. In one embodiment, the diameter of second carbon nanotubes is about 3 nanometers, a thickness of the second carbon nanotube layer is about 3 nanometers, and a length of the second carbon nanotubes ranges from about 5 micrometers to about 100 micrometers.

A direction in a surface of the semiconductor layer 140 from the source electrode 150 to the drain electrode 160 is defined as an X direction. A direction in the surface of the semiconductor layer 140 that substantially perpendicular to the X direction is defined as a Y direction. A direction that substantially perpendicular to the surface of the semiconductor layer 140 is defined as a Z direction. A length of the middle part 142 of the semiconductor layer 140 along the X direction is defined as L. A width of the middle part 142 of the semiconductor layer 140 along the Y direction is defined as W. A resistance R of the middle part 142 of the semiconductor layer 140, the second film resistor $R_{s2}$ of the second carbon nanotube layer, the length L of the middle part 142, and the width W of the middle part 142 satisfy following formula:

$$R = R_{s2} \frac{L}{W}$$

A ratio of the length L and the width W of the middle part 142 is greater than 1. The length L of the middle part 142 is greater than 5 micrometers. The width W of the middle part 142 is equal to or greater than 5 micrometers. In one embodiment, the length L of the middle part 142 is greater than or equal to 40 micrometers and smaller than or equal to 100 micrometers. The second film resistor $R_{s2}$ of the second carbon nanotube layer is greater than or equal to 100 kΩ per square. The resistance R of the middle part 142 is greater than or equal to 100 kΩ. The electric conductivity property of the middle part 142 is between a conductor and an insulator. The middle part 142 has a semiconductor property. In one embodiment, the length L of the middle part 142 is about 40 micrometers, the width W of the middle part 142 is about 5 micrometers, and the second film resistor $R_{s2}$ of the second carbon nanotube layer is about 330 kΩ per square per square.

Length of the first connecting part 144 and the second connecting part 146 along the X direction and the Y direction is arbitrary. In one embodiment, length along the Y direction of the first connecting part 144 and the second connecting part 146 is greater than the width along the Y direction of the middle part 142. In one embodiment, the length along the Y direction of the first connecting part 144 and the second connecting part 146 is about 10 micrometers, and the width along the X direction of the first connecting part 144 and the second connecting part 146 is about 5 micrometers.

The source electrode 150 and the drain electrode 160 are located on the two ends of the semiconductor layer 140 along the X direction. The first connecting part 144 is in contact with a part of the source electrode 150. The second connecting part 146 is in contact with a part of the drain electrode 160. Other part of the source electrode 150 and other part of the drain electrode 160 are exploded to connect with external route electrically (not shown). Because the thickness of the semiconductor layer 140 is small, the semiconductor layer 140, the source electrode 150 and the drain electrode 160 are located on a same surface. The semiconductor layer 140 can only include the middle part 142 with two ends in contact with and electrically connected to the source electrode 150 and the drain electrode 160. Because each of the semiconductor layer 140, the source electrode 150 and the drain electrode 160 includes carbon nanotubes, a great interface between the semiconductor layer 140 and the source electrode 150 or the drain electrode 160 is formed, therefore enhancing the property of the thin film transistor 10.

The material of the insulating layer 130 can be a rigid material such as aluminum oxide ($Al_2O_3$), silicon nitride ($Si_3N_4$), silicon dioxide ($SiO_2$), or a flexible material such as polyethylene terephthalate (PET), benzocyclobutenes (BCB), polyester or acrylic resins. A thickness of the insulating layer 130 can be in a range from about 10 nanometers to about 100 micrometers. In one embodiment, the material of the insulating layer 130 is $Al_2O_3$, and the thickness of the insulating layer 130 is about 40 nanometers.

Figure 5:
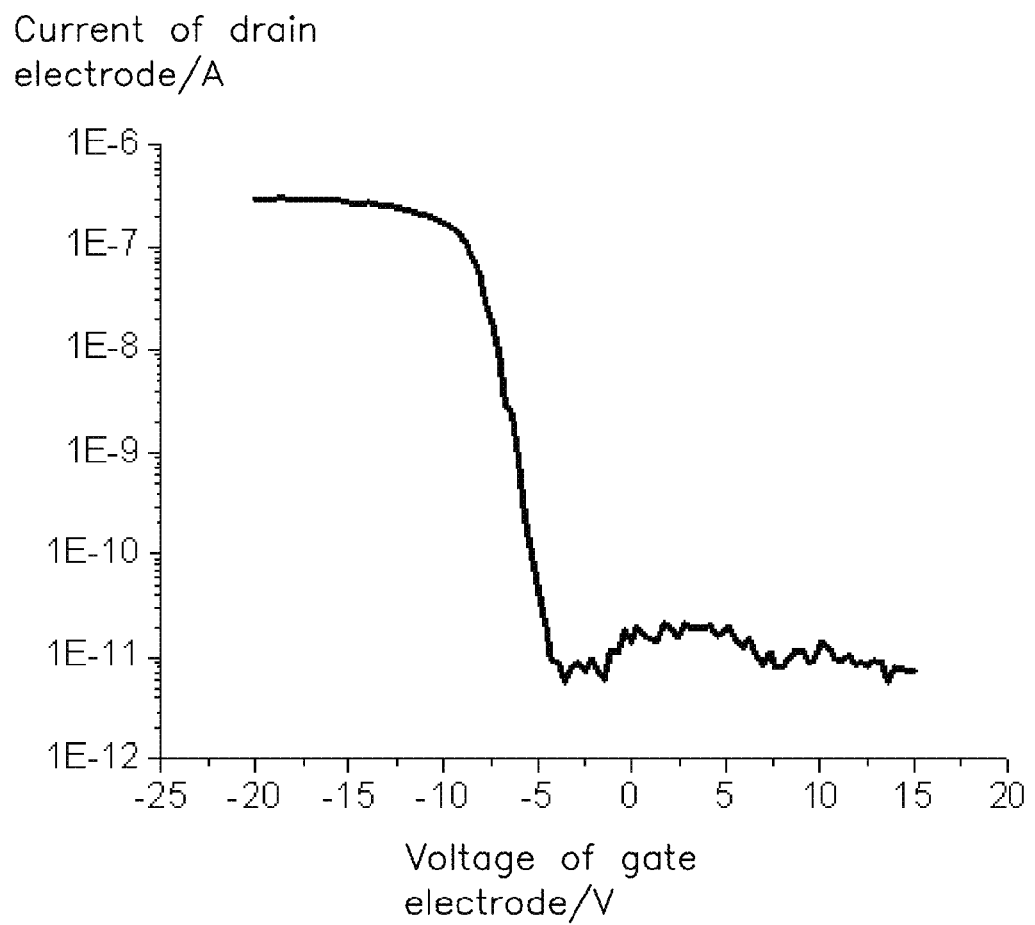
FIG. 5 is a test paragraph of on/off ratio of current of the thin film transistor of FIG. 1.

In use, the source electrode 150 is grounded. A voltage Vds is applied to the drain electrode 160. Another voltage Vg is applied on the gate electrode 120. The voltage Vg forming an electric field in the channel. Accordingly, carriers exist in the channel near the gate electrode 120. As the Vg increasing, a current is generated and flows through the channel. Thus, the source electrode 150 and the drain electrode 160 are electrically connected. Referring to FIG. 5, the thin film transistor 10 has high on/off ratio of current ($>10^4$) and electron mobility.

A method of making the thin film transistor is further provided. The method includes following steps:

Step (S1), providing an insulating substrate 110;

Step (S2), forming a gate electrode 120 on the insulating substrate 110, wherein the gate electrode 120 includes a first carbon nanotube layer with a first film resistor smaller than or equal to 10 kΩ per square;

Step (S3), forming an insulating layer 130 on the gate electrode 120;

Step (S4), forming a source electrode 150 and a drain electrode 160 on the insulating layer 130, wherein the source electrode 150 and the drain electrode 160 are spaced from each other, the source electrode 150 and the drain electrode 160 include a first carbon nanotube layer with a first film resistor smaller than or equal to 10 kΩ per square per square; and Step (S5), forming a semiconductor layer 140 on the insulating layer 130, wherein the semiconductor layer 140 is in contact with the source electrode 150 and the drain electrode 160, and the semiconductor layer 140 includes a second carbon nanotube layer with a second film resistor greater than or equal to 100 kΩ per square per square.

In step (S1), the insulating substrate 110 can be rigid materials, such as glass, crystal, ceramic, diamond, and silicon, or flexible materials such as plastic or resin. In one embodiment, the material of the insulating substrate is polyethylene terephthalate. The insulating substrate 110 can be further hydrophilic treated.

In step (S2), the first carbon nanotube layer includes a plurality of first carbon nanotubes. The first carbon nanotube layer can be an integrity of the plurality of first carbon nanotubes arranged disordered. The method of forming the gate electrode 120 is as follows:

Step (S21), providing a first substrate and pre-treating the first substrate;

Step (S22), depositing a first catalyst layer on a surface of the first substrate;

Step (S23), placing the first substrate with the first catalyst layer in a reactor, and inputting an inert gas to the reactor;

Step (S24), inputting a carbon source gas, and growing the first carbon nanotube layer in a stepped temperature manner via chemical vapor deposition; and Step (S25), transferring the first carbon nanotube layer from the first substrate to the insulating substrate 110 and forming a gate electrode 120.

In step (S21), the first substrate can be further hydrophilic treated for combining with the first catalyst layer better. In one embodiment, the first substrate is pre-treated by following steps: first, hydrophilic-treating the first substrate by hydrogen peroxide and ammonia water; second, treating the first substrate by an organic solvent. After treating by hydrogen peroxide and ammonia water, a surface of the first substrate has a plurality of hydroxyl groups combining with the organic solvent. The organic solvent can include (3-aminopropyl)-triethoxysilane (APTES) with amino group to fix the first catalyst layer.

Figure 6:
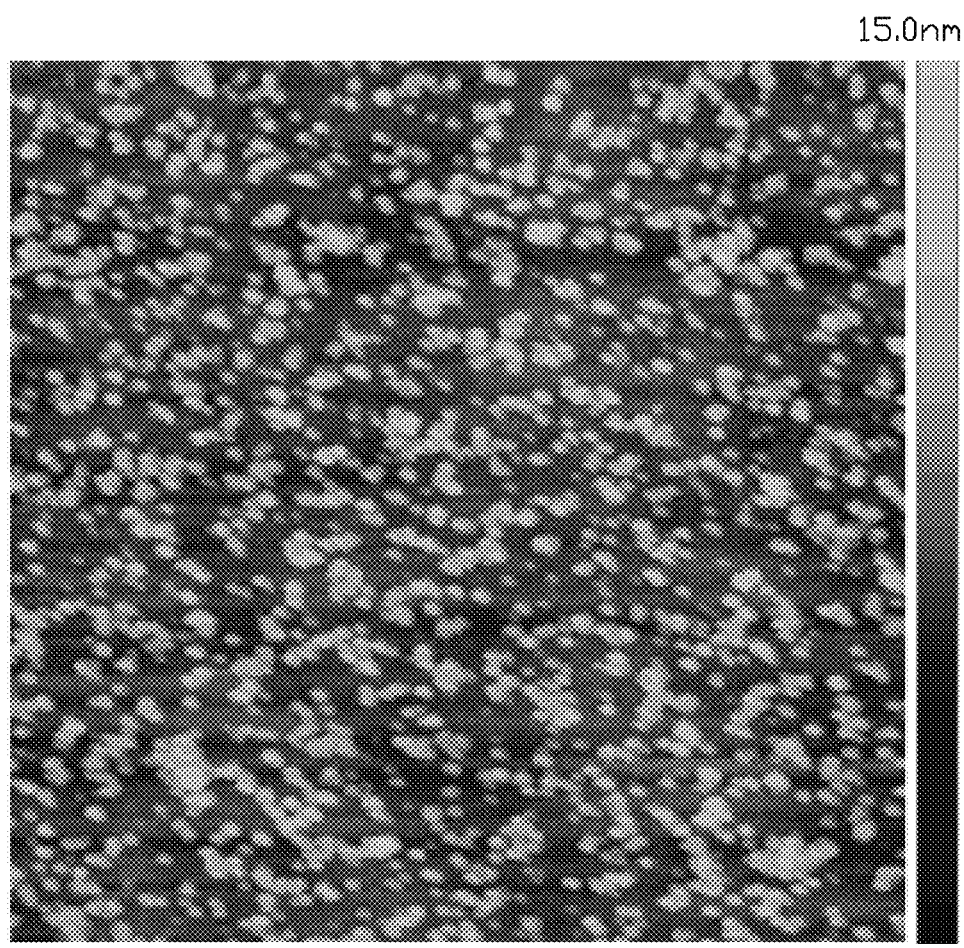
FIG. 6 is an Atomic Force Microscope (AFM) image of a first substrate deposited catalyst for growing the first carbon nanotube layer.

In step (S22), the first catalyst layer includes ferritin, metal, such as iron, cobalt, nickel, or metal oxide. The first catalyst layer can be formed by electron beam evaporation or other electrochemical method. In one embodiment, the first catalyst layer is ferritin. The first catalyst layer is deposited on the first subsrate by following steps: firstly, a first ferritin solvent is obtained by mixing ferritin and water with a first volume ratio; secondly, immersing the first substrate into the first ferritin solvent for a first time. The first volume ratio of ferritin and water can be in a range from about 1:100 to about 1:20. The first time of immersion can be in a range from 20 minutes to 2 hours. In one embodiment, the first volume ratio of ferritin and water is about 1:50, and the first time of immersion is about 1 hour. Referring to FIG. 6, the image is taken from a region of a length of about 1 micrometer and a width of about 1 micrometer, the first catalyst layer includes a plurality of dense catalyst particles, and number of catalyst particles of the first catalyst layer in 1 square micrometers is greater than 800. Because the distribution density of catalyst particles of the first catalyst layer is large, the plurality of first carbon nanotubes has a large distribution density and forms an electric conductive network.

In step (S23), inputting the inert gas to the reactor is to make sure that environment of the reactor has no oxygen. The inert gas can be nitrogen or argon. In one embodiment, the inert gas is argon.

In step (S24), the carbon source gas can be methane, methanol, ethanol, ethylene, or acetylene. The stepped temperature manner is as follows: step (a), oxidizing a plurality of catalyst particles of the first catalyst layer in air atmosphere under a first temperature for 5 minutes to 30 minutes; step (b), reducing the plurality of catalyst particles in hydrogen or ammonia atmosphere under a second temperature for 5 minutes to 30 minutes; step (c), inputting the carbon source gas under a third temperature for a growing time and growing the plurality of first carbon nanotubes. The growing time of making the first carbon nanotube layer is in a range from about 20 minutes to about 2 hours. The first temperature is in a range from about 650 degrees centigrade to about 750 degrees centigrade. The second temperature is in a range from about 750 degrees centigrade to about 850 degrees centigrade. The third temperature is in a range from about 850 degrees centigrade to about 950 degrees centigrade. Number of single-walled carbon nanotube of the first carbon nanotube layer in 1 square micrometers is greater than 20. In one embodiment, the carbon source gas is a mixed gas of ethanol, methanol and methane with a carrier gas of hydrogen. A volume ratio of methanol and ethanol is in a range from about 1:1 to about 1:5. In one embodiment, the volume ratio of methanol and ethanol is about 1:3. A flowing rate of the carrier gas is in a range from about 50 standard-state cubic centimeter per minute (sccm) to about 200 sccm. A flowing rate of methane gas is in a range from about 50 sccm to about 200 sccm. In one embodiment, the flowing rate of the carrier gas is about 100 sccm, the flowing rate of methane gas is about 100 sccm, the stepped temperature manner includes: step (a) is under about 700 degrees centigrade for about 20 minutes, step (b) is under about 800 degrees centigrade for about 20 minutes, and step (c) is under the third temperature is about 900 degrees centigrade for about 1 hour, the first film resistor of the first carbon nanotube layer is about 5 kΩ per square per square, and a thickness of the first carbon nanotube layer is about 6 nanometers.

In step (S25), the first carbon nanotube layer is transferred as a whole. The first carbon nanotube layer can be transferred by a dry transferring method or a wet transferring method. The dry transferring method includes following steps: coating the first carbon nanotube layer by an adhesive belt; and detaching the adhesive belt via heating under a temperature from about 90 degrees centigrade to 150 degrees centigrade. In one embodiment, the adhesive belt is detached via heating under about 120 degrees centigrade. The wet transferring method includes following steps:
- (a1) coating the organic adhesive layer on the first carbon nanotube layer and solidifying the organic adhesive layer;
- (b1) detaching the first single-walled carbon nanotube layer from the first substrate onto the organic adhesive layer via a reactive reagent;
- (c1) placing the first carbon nanotube layer and the organic adhesive layer on the insulating substrate 110; and
- (d1) removing the organic adhesive layer by an organic solvent.

The material of the organic adhesive layer can be positive photoresist ZEP or polymethylmethacrylate (PMMA). The reactive reagent can react with the first substrate to separate the first carbon nanotube layer from the first substrate. The reactive reagent can be hydrogen fluoride, carbon fluoride, sodium hydroxide, or potassium hydroxide. In one embodiment, the organic adhesive layer is PMMA. The first carbon nanotube layer can maintain the original structure by the organic adhesive layer.

After transferring, the first carbon nanotube layer can be etched to form the gate electrode 120. The method of etching the first carbon nanotube layer can be photolithography method, reactive ion etching method (RIE), or oxidation method. In one embodiment, etching the first carbon nanotube layer includes following steps:
- (a2) forming a mask on a surface of the first carbon nanotube layer, wherein the mask is a hydrogen silsesquioxane layer;
- (b2) etching part of the mask to obtain a mask with a pattern and exposing part of the first carbon nanotube layer;
- (c2) removing the exposed first carbon nanotube layer via RIE method; and
- (d2) removing the mask.

In step (S4), the insulating layer 130 can be formed via evaporating, sputtering, or atom layer depositing. In one embodiment, the insulating layer 130 is formed on a surface of the gate electrode 120 away from the insulating substrate 110 via evaporating, the gate electrode 120 is covered by the insulating layer 130 totally, material of the insulating layer 130 is aluminum oxide, and a thickness of the insulating layer 130 is about 40 nanometers.

In step (S4), forming the source electrode 150 and the drain electrode 160 includes following steps: forming the first carbon nanotube layer on a surface of the insulating layer 130, and etching the first carbon nanotube layer. Etching the first carbon nanotube layer is same as that of step (S3). In one embodiment, the length along the Y direction of the source electrode 150 and the drain electrode 160 is about 10 micrometers, and the width along the X direction of the source electrode 150 and the drain electrode 160 is about 5 micrometers.

Figure 7:
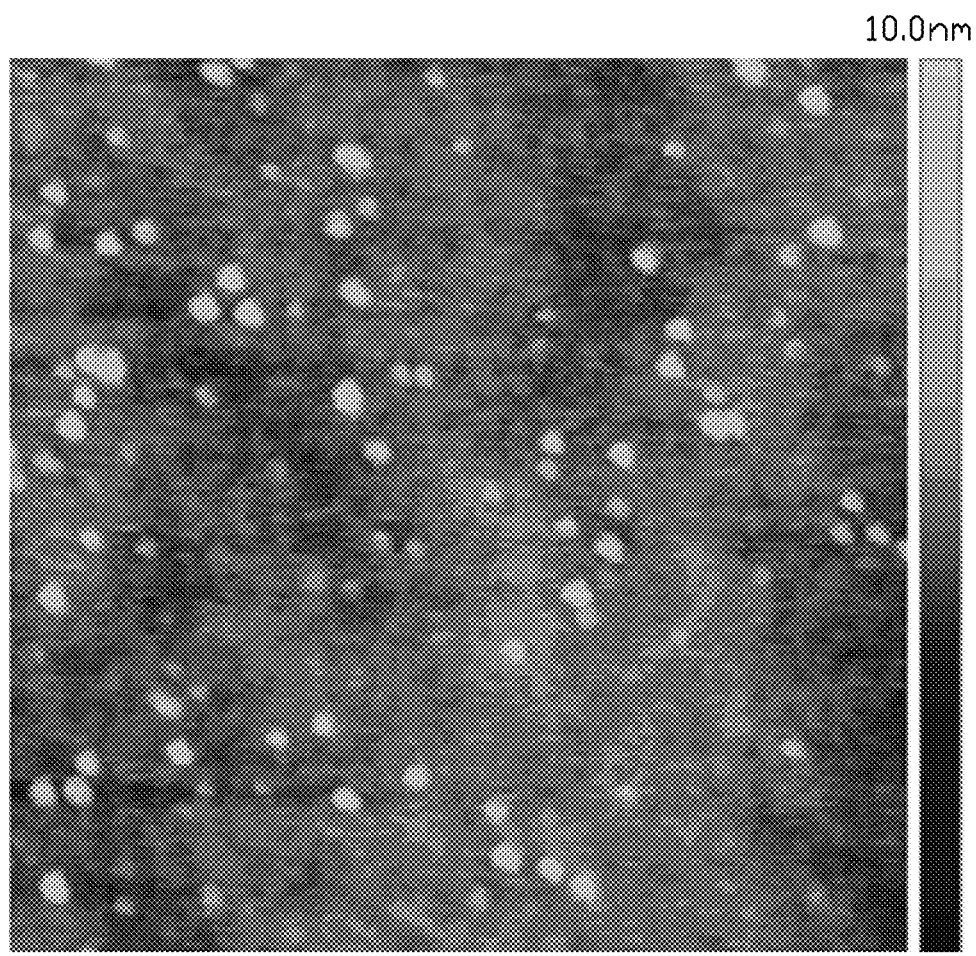
FIG. 7 is an AFM image of a second substrate deposited catalyst for growing the second carbon nanotube layer.

In step (S5), making the second carbon nanotube layer is simple as making the first carbon nanotube layer of step (S2). The difference of step (S5) and step (S2) is that the volume ratio of ferritin and water and the growing time. The volume ratio of ferritin and water of making the second carbon nanotube layer is in a range from about 1:8000 to about 1:1000. The growing time of making the second carbon nanotube layer is in a range from about 30 seconds to about 5 minutes. Number of the plurality of second carbon nanotubes in 1 square micrometers is smaller than 1. Therefore, the second carbon nanotube layer has a semi-conductive property. Referring to FIG. 7, the image is taken from a region of a length of about 1 micrometer and a width of about 1 micrometer, the second catalyst layer includes a plurality of second catalyst particles, and number of second catalyst particles in 1 square micrometers is about 60. In one embodiment, the volume ratio of ferritin and water of making the second carbon nanotube layer is about 1:2000, the growing time is about 1 minute, and second film resistor of the second carbon nanotube layer is about 330 k$\Omega$ per square per square, and a thickness of the second carbon nanotube layer is about 3 nanometers.

Part of the second carbon nanotube layer can further be etched to obtain the semiconductor layer 140. The method of etching part of the second carbon nanotube layer is same as that of etching the first carbon nanotube layer of step (S4). The semiconductor layer 140 is formed by selectively etching part of the second carbon nanotube layer between the source electrode 150 and the drain electrode 160. A ratio of the length and the width of the middle part 142 is greater than 1. The length of the channel is greater than 5 micrometers. The width of the middle part 142 is equal to or greater than 5 micrometers. The middle part 142 has great semiconductor property.

The second carbon nanotube layer cannot be etched so that a large first connecting part 144 and a large second connecting part 146 are formed. The large first connecting part 144 and large second connecting part 146 can be in firmly contact with the source electrode 150 and the drain electrode 160 respectively.

In one embodiment, the length L of the middle part 142 is about 40 micrometers, the width W of the middle part 142 is about 5 micrometers, the length along the Y direction of the first connecting part 144 and the second connecting part 146 is about 10 micrometers, and the width along the X direction of the first connecting part 144 and the second connecting part 146 is about 5 micrometers.

In the method for making the thin film transistor 10, because the distribution density of the plurality of second carbon nanotubes is smaller than that of the plurality of first carbon nanotubes, the step (S4) of forming the source electrode 150 and the drain electrode 160 are before the step (S8) of forming the semiconductor layer 140, in order to avoid the second carbon nanotube layer being etched excessively. In one embodiment, the source electrode 150 and the drain electrode 160 are formed at first, then the second carbon nanotube layer is placed on the source electrode 150 and the drain electrode 160, part of the second carbon nanotube layer is etched on the insulating layer 13, and the channel is obtained.

Figure 8:
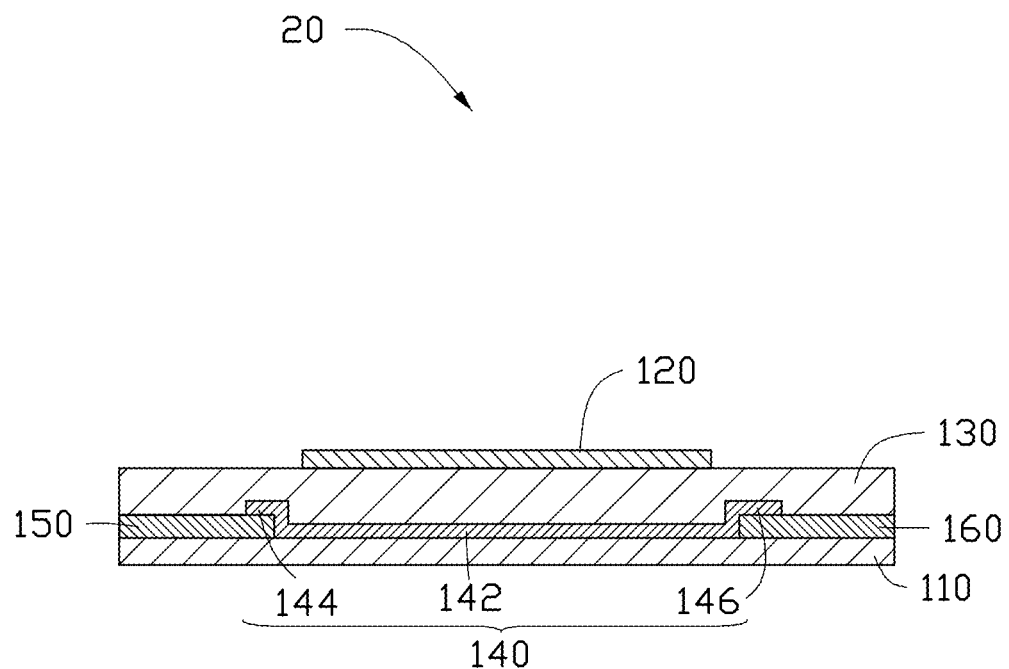
FIG. 8 is a cross sectional view of another embodiment of a thin film transistor.

Referring to FIG. 8, a thin film transistor 10 of another embodiment includes a gate electrode 120, an insulating layer 130, a semiconductor layer 140, a source electrode 150, and a drain electrode 160. The source electrode 150 and the drain electrode 160 are spaced from each other. The semiconductor layer 140 is electrically connected to the source electrode 150 and the drain electrode 160. The gate electrode 120 is insulated from the semiconductor layer 140, the source electrode 150, and the drain electrode 160 through the insulating layer 130. The thin film transistor 20 is positioned on a surface of an insulating substrate 110.

The structure of the thin film transistor 20 is similar with that of the thin film transistor 10. The difference between the thin film transistor 20 and the thin film transistor 10 is that the source electrode 150 and the drain electrode 160 are located on the insulating substrate 110, the semiconductor layer 140 is located on the insulating substrate 110 and extends onto the source electrode 150 and the drain electrode 160, and the insulating layer 130 covers the semiconductor layer 140, the source electrode 150, and the drain electrode 160. The gate electrode 120 is located on a surface of the insulating layer 130 away from the insulating substrate 110. The semiconductor layer includes a middle part 142. The middle part 142 is between the source electrode 150 and the drain electrode 160.

The thin film transistor has following advantages. Firstly, the material of the semiconductor layer 140, the source electrode 150, and the drain electrode 160 is carbon nanotubes, the interface resistance between the semiconductor layer 140 and the source electrode 150 or the drain electrode 160 is reduced, and on/off ratio of current and electron mobility of the thin film transistor is enhanced. Secondly, the diameter of the single-walled carbon nanotube is less than 10 nanometers, the thickness of the first carbon nanotube layer and the second carbon nanotube layer is small, thus the light transmittance of the thin film transistor is high.

Depending on the embodiments, certain of the steps described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure.

What is claimed is:

1. A thin film transistor comprising:
   an insulating layer having a first surface and a second surface;
   a gate electrode located on the first surface of the insulating layer;
   a source electrode;
   a drain electrode spaced from the source electrode; and
   a semiconductor layer electrically connected with the source electrode and the drain electrode;
   wherein the source electrode, the drain electrode, and the semiconductor layer are located on the second surface of the insulating layer; the semiconductor layer comprises a middle part, a first connecting part, and a second connecting part; the middle part is located between the first connecting part and the second connecting part and is defined as a channel, the first connecting part is overlapped with the source electrode, and the second connecting part is overlapped with the drain electrode; each of the gate electrode, the source electrode, and the drain electrode comprises a first carbon nanotube layer; and the semiconductor layer comprises a second carbon nanotube layer, a first sheet resistance of the first carbon nanotube layer is smaller than or equal to 10 kΩ per square, and a second sheet resistance of the second carbon nanotube layer is greater than or equal to 100 kΩ per square.

2. The thin film transistor of claim 1, wherein the semiconductor layer is located between the drain electrode and the source electrode.

3. The thin film transistor of claim 1, wherein a width of the first connecting part and the second connecting part is greater than a width of the middle part.

4. The thin film transistor of claim 1, wherein a ratio of a length of the middle part and a width of the middle part is greater than 1, the length of the middle part is greater than 5 micrometers, and the width of the middle part is greater than or equal to 5 micrometers.

5. The thin film transistor of claim 4, wherein the semiconductor layer extends onto the source electrode and the drain electrode.

6. The thin film transistor of claim 1, wherein the first carbon nanotube layer comprises a plurality of first carbon nanotubes joined by van der Waals attractive force, and the plurality of first carbon nanotubes is disorderly arranged.

7. The thin film transistor of claim 6, wherein number of the plurality of first carbon nanotubes in 1 square micrometers is equal to or greater than 20.

8. The thin film transistor of claim 1, wherein the second carbon nanotube layer comprises a plurality of second carbon nanotubes joined by van der Waals attractive force, and the plurality of second carbon nanotubes is disorderly arranged.

9. The thin film transistor of claim 8, wherein number of the plurality of second carbon nanotubes in 1 square micrometers is smaller than or equal to 1.

10. A thin film transistor comprising:
    an insulating layer having a first surface and a second surface;
    a gate electrode located on the first surface of the insulating layer;
    a source electrode;
    a drain electrode spaced from the source electrode; and
    a semiconductor layer electrically connected with the source electrode and the drain electrode;
    wherein the source electrode, the drain electrode, and the semiconductor layer are located on the second surface of the insulating layer; each of the gate electrode, the source electrode, and the drain electrode comprises a first carbon nanotube layer; the semiconductor layer comprises a second carbon nanotube layer, a first sheet resistance of the first carbon nanotube layer is smaller than or equal to 10 kΩ per square, and a second sheet resistance of the second carbon nanotube layer is greater than or equal to 100 kΩ per square; and the first carbon nanotube layer comprises a plurality of first carbon nanotubes joined by van der Waals attractive force, and the plurality of first carbon nanotubes is disorderly arranged.

11. The thin film transistor of claim 10, wherein number of the plurality of first carbon nanotubes in 1 square micrometers is equal to or greater than 20.

12. A thin film transistor comprising:
    an insulating layer having a first surface and a second surface;
    a gate electrode located on the first surface of the insulating layer;
    a source electrode;
    a drain electrode spaced from the source electrode; and
    a semiconductor layer electrically connected with the source electrode and the drain electrode;
    wherein the source electrode, the drain electrode, and the semiconductor layer are located on the second surface of the insulating layer; each of the gate electrode, the source electrode, and the drain electrode comprises a first carbon nanotube layer; the semiconductor layer comprises a second carbon nanotube layer, a first sheet resistance of the first carbon nanotube layer is smaller than or equal to 10 kΩ per square, and a second sheet resistance of the second carbon nanotube layer is greater than or equal to 100 kΩ per square; and the second carbon nanotube layer comprises a plurality of second carbon nanotubes joined by van der Waals attractive force, and the plurality of second carbon nanotubes is disorderly arranged.

13. The thin film transistor of claim 12, wherein number of the plurality of second carbon nanotubes in 1 square micrometers is smaller than or equal to 1.

* * * * *